United States Patent [19]
Chao

[11] Patent Number: 4,755,477
[45] Date of Patent: Jul. 5, 1988

[54] OVERHANG ISOLATION TECHNOLOGY

[75] Inventor: Fung-Ching Chao, Tainan Shih, Taiwan

[73] Assignee: Industrial Technology Research Institute, Hsinchu, Taiwan

[21] Appl. No.: 29,621

[22] Filed: Mar. 24, 1987

[51] Int. Cl.$^4$ .................. H01L 21/467; H01L 21/473; H01L 21/475; H01L 21/76
[52] U.S. Cl. ...................................... 437/36; 437/62; 437/64; 437/73; 437/80; 437/228
[58] Field of Search ............... 148/DIG. 51; 156/643, 156/657, 659.1, 662; 437/36, 62, 64, 73, 80, 228, 233, 238, 239, 241, 978

[56] References Cited

U.S. PATENT DOCUMENTS

| | | | |
|---|---|---|---|
| 4,271,583 | 6/1981 | Kahng | 437/73 |
| 4,407,696 | 6/1983 | Han et al. | 437/69 |
| 4,472,873 | 9/1984 | Ko | 437/33 |
| 4,477,310 | 10/1984 | Park et al. | 437/57 |
| 4,541,167 | 9/1985 | Havemann et al. | 29/576 W |
| 4,551,910 | 1/1985 | Patterson | 437/69 |
| 4,571,819 | 2/1986 | Rogers et al. | 437/62 |
| 4,582,565 | 4/1986 | Kawakatsu | 437/62 |

FOREIGN PATENT DOCUMENTS 0164186 12/1985 European Pat. Off. ......... 29/576 W

OTHER PUBLICATIONS

K. Y. Chiu et al. "The SWAMI—a Defect Free and Near-Zero Bird's-Beak Local Oxidation Process ..." IEDM 82, Sec. 9.3, 224-7 (1982).
J. Hui et al. "Electrical Properties of MOS Devices ..." IEDM 82, Sec. 9.2, pp. 220-223 (1982).
K. Kurosawa et al. "A New Bird's-Beak Free Field Isolation Technology ..." IEDM 81, Sec. 16.4, pp. 384-387 (1981).
J. Matsunaga et al. "Selective Polysilicon Oxidation Technology ..." IEDM 80, Sec. 22.4, pp. 565-568 (1980).
I. Magdo et al., "Framed Recessed Oxide Scheme ..." J. Electrochem Soc: Solid-State Sci & Tech, vol. 125, No. 6, 932-936 (1978).
Y. Tamaki et al., "Evaluation of Dislocation ..." J. Electrochem Soc: Solid-State Sci & Tech, vol. 130, No. 11, 2266-2270 (1983).

Primary Examiner—Olik Chaudhuri
Attorney, Agent, or Firm—Bert J. Lewen; Henry Sternberg

[57] ABSTRACT

A process for defining isolation structures between active regions of an integrated circuit is disclosed. The technique includes first forming a thermally grown silicon dioxide layer. A polysilicon layer is then deposited over the silicon dioxide layer and a silicon nitride-I layer is deposited thereon. A photo-resist mask is then formed on the top of the laminate and selective anisotropic dry etching is used to remove the unmasked silicon nitride-I and polysilicon layers. This step is followed by an isotropic dry etching to undercut the polysilicon beneath the silicon nitride-I layer. After the photo-resist masks and unmasked pad oxide are removed, a layer of silicon nitride-II is deposited. Thereafter, an anisotropic dry etching step is performed to remove the unmasked silicon nitride-II completely. An implantation step is then optionally performed. The uncovered silicon substrate is oxidized to form the isolation regions and, finally, the residual layers of silicon nitride-I, -II, polysilicon and pad oxide are removed. The silicon nitride-I and -II layers may be removed with boiling $H_3PO_4$, the polysilicon layer by using reactive-ion etching, and the pad oxide layer by using 50:1 hydrogen fluoride.

14 Claims, 3 Drawing Sheets

OVERHANG ISOLATION TECHNOLOGY

BACKGROUND OF THE INVENTION

Virtually all modern MOS and bipolar integrated circuits use the local oxidation of silicon (LOCOS) technique to develop regions which will laterally isolate the devices on the integrated circuit. This isolation structure is typically formed by ion-implantation doping of the field region, followed by the local growth of the thick field oxide. The active device regions are protected during these steps by masking layers of silicon nitride which are subsequently removed.

Unfortunately, the LOCOS process results in the lateral oxidation of the silicon underneath the nitride mask, forming the so-called "bird's beak effect". This effect is graphically illustrated in FIGS. 1 and 7 of U.S. Pat. No. 4,551,910. Since the "bird's beak" is insufficiently thick to form effective isolation, but sufficiently thick to prevent the formation of an active device where it is located, it reduces the effective device area and becomes one of the limiting factors in achieving high packing density for very large scale integrated circuits.

It has long been recognized in the prior art that it is desirable to reduce the bird's beak to minimize the transition regions between active areas. Other isolation technologies have been proposed as alternatives for LOCOS. For example, the side wall masked isolation (SWAMI) technique has been proposed which involves the addition of a second nitride layer on the side wall. See FIG. 2, p. 226, of K. Y. Chiu et al., "The SWAMI—A Defect Free and Near-Zero Bird's-Beak Local Oxidation Process and Its Application in VLSI Technology," *IEDM 82* (*International Electron Device Meeting*, 1982), Sec. 9.3, pp. 224–227 (1982). Thus U.S. Pat. No. 4,477,310 shows the use of nitride layers on the side wall of active regions. However, fully recessed field oxide layers are formed from an unmasked silicon substrate.

Still another method described is the so-called sealed interface local oxidation (SILO) technique which uses three layers of nitride over silicon followed by an oxide layer and a cap nitride layer. See FIG. 1, p. 223, of J. Hui et al., "Electrical Properties of MOS Devices Made With SILO Technology," *IEDM 82*, Sec. 9.2, pp. 220–223 (1982).

Also, the buried oxide (BOX) technique has been devised which uses an aluminum mask to etch a silicon groove and the subsequent removal of a plasma deposited silicon dioxide layer. See FIG. 1, p. 386, of K. Kurosawa et al., "A New Bird's-Beak Free Field Isolation Technology for VLSI Devices," *IEDM 81*, Sec. 16.4, pp. 384–387 (1981). Still another technique involves the selective polysilicon oxidation using three layers of silicon dioxide over silicon followed by a polysilicon and cap nitride; see FIG. 1, p. 566, of J. Matsunaga et al., "Selective Polysilicon Oxidation Technology for Defect Free Isolation," *IEDM 80*, Sec. 22.4, pp. 565–568 (1980).

Unfortunately, the SILO technique is not fully effective because of contamination and defects at the silicon/nitride interface which cannot be easily controlled. The SWAMI and BOX techniques are far too complicated, the BOX technique requiring several masking steps to achieve good planarity. The selective polysilicon oxidation (SEPOX) technology causes reentrant corners at the field oxide edges.

Other prior art relating to the formation of dielectric isolation for integrated semiconductor devices include U.S. Pat. No. 4,582,565 to Kawakatsu which employs a trench isolation technique. In this structure the silicon substrate is disturbed by virtue of the formation of the trench and requires the deposition of insulating layers on the lengthy vertical surfaces of the trench. Long narrow trenches are difficult to fill completely. The resulting tendency to form voids is well known. In addition, a planar-type structure is formed.

Kahng U.S. Pat. No. 4,271,583 shows a process for forming a planar structure with fully recessed oxide isolation regions. In addition, in the anisotropic etching step, the silicon dioxide layer 23 lies adjacent to a portion of the substrate 13 which is subject to oxidation. This procedure allows the diffusion of oxygen laterally through the layer 23, thereby reducing the device area of the structure.

Rogers et al. U.S. Pat. No. 4,571,819 recognizes the difficulty of forming trench isolation oxides, particularly the problem of void formation. The field oxide is deposited by low pressure chemical vapor deposition, a technique which does not produce a high quality field oxide. In addition, the process shown is cumbersome, since the voids formed in the oxide must be eliminated by a melting and reflowing process.

Ko U.S. Pat. No. 4,472,873 shows a typical recesses LOCOS process. FIG. 1C shows the formation of the so-called "bird's beak" which is aggravated by the presence of the silicon oxide layer 14$b$ adjacent to the edges 13$a$ and 13$b$ which are to be oxidized.

Han et al. U.S. Pat. No. 4,407,696 also shows an approach to eliminate the problem of the bird's beak effect in the fabrication of isolation oxidation regions for MOS circuits. In this procedure, the initial oxidation region shown has extensive bird's beak, largely resulting from the lateral migration of the oxygen along the stress release layer 26. To reduce the bird's beak, an extra etching step is required to redefine the oxidation region.

BRIEF DESCRIPTION OF THE INVENTION

The subject invention is directed to a method of minimizing the bird's beak effect when forming isolation structures between active regions in an integrated circuit to allow for greater circuit density. Specifically, a method is described which minimizes the lateral oxidation under a layer of silicon nitride during the field oxidation step. The field oxide is formed by exposing the substrate to an oxidative environment at elevated temperatures.

Manufacturing begins by growing a thin film of silicon dioxide on a silicon wafer. Then a layer of polysilicon and a first layer of silicon nitride are put on top of the layer of silicon dioxide. A photo-resist coating is placed on the first layer of silicon nitride to mask the active regions. The composite is etched anisotropically with the unmasked portions of silicon nitride and polysilicon being removed vertically until the silicon dioxide layer is reached. The structure is then plasma-etched with the polysilicon layer being undercut (0.2 micrometers) beneath the silicon nitride layer. Thereafter, the photo-resist masking pattern is removed by stripping with sulfuric acid. At this point the structure is a silicon substrate with a layer of silicon dioxide, and a pedestal of polysilicon with silicon nitride overhanging the polysilicon. The unmasked silicon dioxide is then removed with a buffered oxide etching solution. A second layer of silicon nitride is then applied to cover the first layer of silicon nitride, the sidewalls of the polysilicon pedestal and the silicon dioxide, and the exposed silicon substrate. The structure is then etched anisotropically by reactive-ion etching (RIE) to remove the second layer of silicon nitride vertically from the surface of the first layer of silicon nitride and the surface of the silicon substrate that is not covered by the overhang. The exposed silicon substrate is doped with channel stopping ions, such as boron.

A feature of this invention is that the thickness of the first layer of silicon nitride prevents ions from penetrating the active region; hence the mask is already in place. When the structure is exposed to a high temperature field oxidation, the silicon dioxide forms in the field regions. Some lateral oxidation occurs under the second layer of silicon nitride to form a bird's beak region; however, the length of the bird's beak created when using this technique is much shorter than that created using a conventional LOCOS process. The final step is to remove the polysilicon, the pad oxide and layers of silicon nitride to expose the active region.

Key features of the invention are that there is no stress release oxide between the second layer silicon nitride stripes around the polysilicon pedestal and the silicon substrate, and that the thin second layer silicon nitride stripes minimize the bird's beak region without increasing defect densities. In addition, the steps employed in the overhang structure formed in the invention do not etch the silicon substrate. This prevents the formation of dislocations due to stress concentration resulting from the volume expansion of $SiO_2$ film during oxidation. The invention can be used to increase the circuit density of a very large scale integrated (VLSI) circuit.

BRIEF DESCRIPTION OF THE DRAWINGS

All of the figures represent a transverse sectional view of a portion of a silicon chip, at different stages of the process of the invention. The designation "POLY" refers to the polysilicon layer.

DETAILED DESCRIPTION OF THE INVENTION

According to the present invention, an improved method is provided to define isolation structures between active region with minimized bird's beak length and defect density along the field oxide edges. This technique finds particular application in the processing of silicon wafers for integrated circuit chips. A preferred embodiment of the invention will be described for this particular application.

Figure 1:
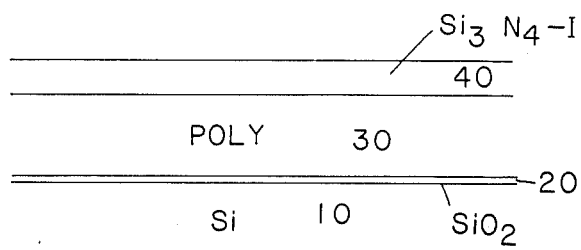
FIG. 1 illustrates the chip, ready for patterning, having deposited thereon a silicon nitride-I layer, a polysilicon layer, and a thermally grown silicon dioxide layer.

Referring now to the drawings, FIG. 1 depicts a silicon wafer, designated by the reference character 10, having grown thereon a thin film of silicon dioxide ($SiO_2$) 20. On top of the $SiO_2$ are a layer of polysilicon 30 and a layer of silicon nitride-I 40. The thickness of the silicon dioxide layer is 550 Angstroms typically. The thickness of the polysilicon layer is 4400 Ang. typically. The thickness of the silicon nitride-I layer is 1500 Ang. typically.

Figure 2:
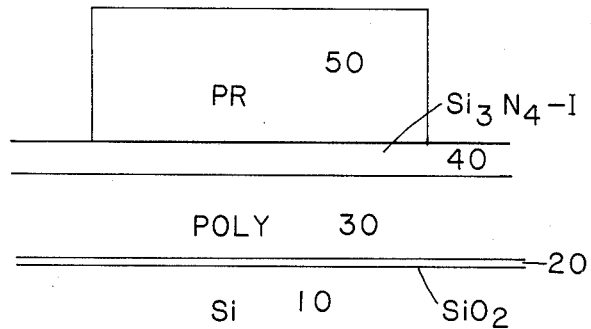
FIG. 2 shows the photo-resist pattern used to define the active region.
Figure 3:
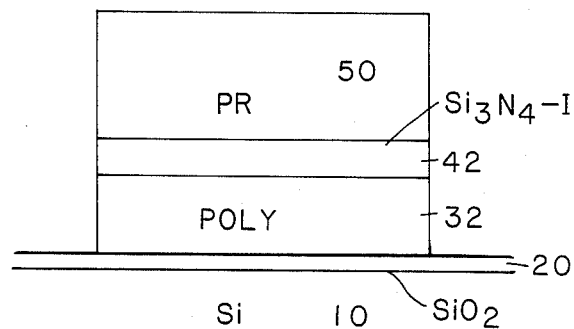
FIG. 3 shows the silicon nitride-I and polysilicon layers after the anisotropic etching according to the invention.

A standard photo-resist coating, exposure and development are utilized to mask the active regions, as shown in FIG. 2, on the surface of the silicon nitride-I layer. Normally there are a great number of patterns on each wafer, but only one (designated by the reference character 50) is shown for purposes of illustration. The pattern, after the selective anisotropic removal of the silicon nitride-I and the polysilicon, is shown in FIG. 3. As can be seen, the unmasked portions of silicon nitride-I 40 and polysilicon 30 are removed vertically until the pad oxide 20 is reached. The remainder of silicon nitride-I (designated by the reference character 42) and the remainder of polysilicon (designated by the reference character 32) are left beneath the photo-resist masking pattern 50. This is the result of the anisotropic character of this etching step. The anisotropic etching can be performed in the reactive ion etching system, for example, AME-8110 system (trademark of Applied Material Co.). For silicon nitride etching, 60 SCCM of $CHF_3$, 35 SCCM of $O_2$, a pressure of 40 mtorr and a power of 600 watts with etch rate 630±10 Angstroms/min are used. For polysilicon etching, 65 SCCM of Ar, 20 SCCM of $NF_3$, a pressure of 40 mtorr and a DC bias of −230 V are employed, with etch rate 250±15 Angstroms/min.

Figure 4:
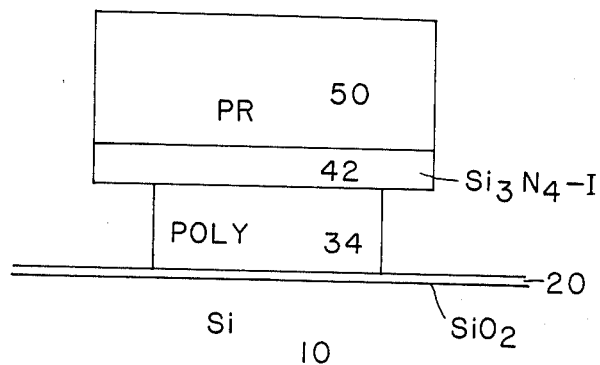
FIG. 4 shows the chip after the isotropic etch which undercuts the polysilicon layer to form the silicon nitride-I overhang.
Figure 5:
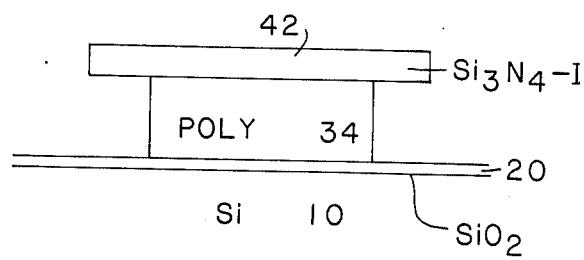
FIG. 5 shows the structure after the removal of the photo-resist layer.

FIG. 4 shows the resulting structure after the isotropic plasma etching of the polysilicon and the desired polysilicon undercutting. As shown, there remains a patterned polysilicon 34, typically undercut 0.2 um for one side, under the silicon nitride-I remainder 42. The isotropic etching can be performed in a plasma etching system, for example, Tegal-701 system (trademark of the Tegal Corporation of Novato, Calif.). For polysilicon etching, 2.62 SCCM of $SF_6$, a pressure of 300 mtorr and a power of 40 W, etching 4 sec. is used to obtain a 0.2 um polysilicon undercut for one side. FIG. 5 shows the resulting structure after the stripping of the photo-resist masking pattern 50 with, for example, a sulfur acid stripping solution. As shown, the silicon nitride-I 42 remains overhanging the polysilicon layer 34.

Figure 6:
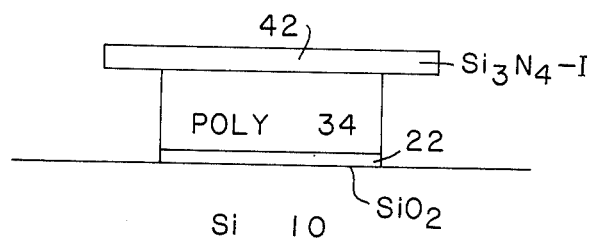
FIG. 6 shows the chip after the etch of the unmasked portion of the silicon dioxide layer.

FIG. 6 shows the pad oxide after the removal of the unmasked portion. A portion of the pad oxide, designated by the reference character 22, remains under the polysilicon pattern 34. The pad oxide is typically removed by using buffered oxide etchant (B.O.E.) solution.

Figure 7:
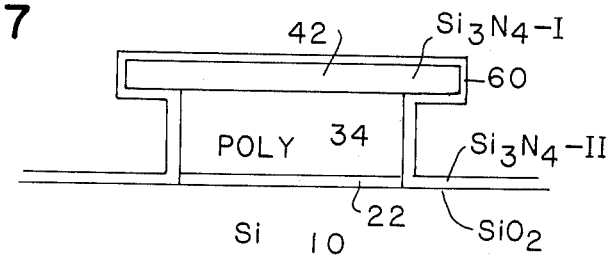
FIG. 7 shows the silicon nitride-II layer deposited on top of the silicon nitride-I and substrate layers. In addition, the vertical surfaces of the silicon nitride-I, polysilicon and pad oxide layers are coated.

As shown in FIG. 7, a silicon nitride-II layer 60 is deposited on the surface of the silicon wafer 10, on the sidewalls of the pad oxide remainder 22 and polysilicon remainder 34, and on the exposed surfaces of the silicon nitride-I remainder 42. The silicon nitride-I remainder 42 and silicon nitride-II 60 serve as an oxidation resisting layer during the field oxidation step. The thickness of the silicon nitride-II layer 60 is less than 700 Ang. so as to minimize stress between the silicon nitride-II 60 and silicon wafer 10 layers. Typically, 400 Ang. silicon nitride-II layer is suitable for processing.

Figure 8:
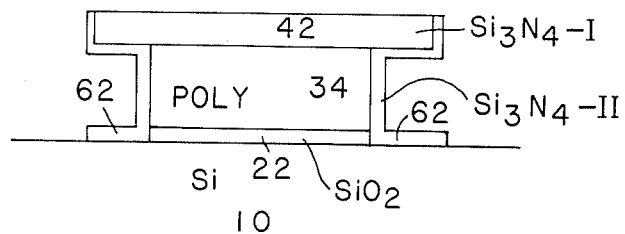
FIG. 8 illustrates the structure after the etching of the silicon nitride-II layer and the silicon nitride II remainder beneath the silicon nitride-I overhang.

Thereafter, an anisotropic etching step is performed to remove vertically the silicon nitride-II layer 60 until the surface of the silicon wafer 10 is exposed. As shown in FIG. 8, the remainder of the silicon nitride-II layer, designated by the reference character 62, is left under the silicon nitride-I overhang 42. This is the result of the anisotropic character of the etch. Reactive-ion etching (RIE) is the most common method to provide anisotropic etching characteristics.

Figure 9:
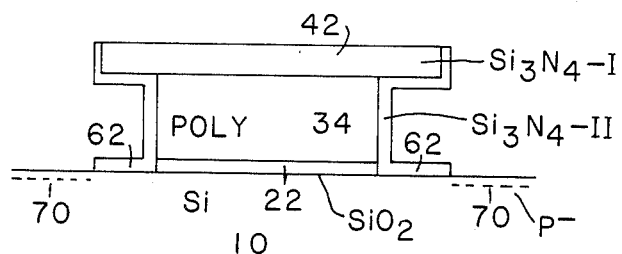
FIG. 9 shows the implanted channel stopping ions.

FIG. 9 shows implanted channel stopping ions 70 in the silicon substrate. Dopant, concentration and energy of implantation are properly chosen, as will be understood by those skilled in the art, to adjust the field threshold voltage. For example, a boron dopant, 4E13 No/cm$^2$ and 25 kev of implantation combining a 6000 Ang. field oxide are used to obtain 12 v field threshold voltage for a p-type wafer with a resistivity of 40–60 ohm-cm. The thickness of the silicon nitride-I layer and energy of field implantation are properly designed to prevent the ions from penetrating into active regions masked by the silicon nitride-I remainder 42.

Figure 10:
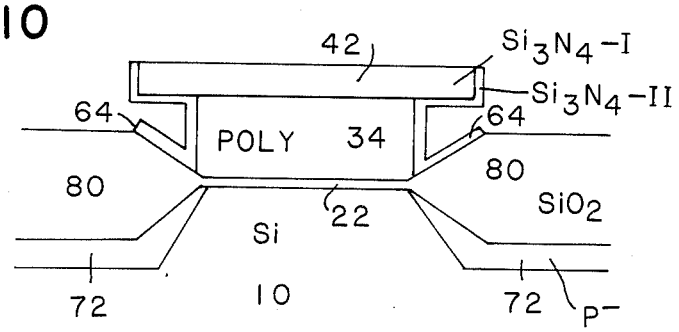
FIG. 10 shows the field oxide isolation region formed by the oxidation of the unmasked silicon substrate.

FIG. 10 shows the cross-sectional view of the structure after high temperature oxidation. During this oxidation step, the unmasked silicon substrate is oxidized to form silicon dioxide, designated by the reference character 80, and the channel stopping ions 70 are diffused into the silicon substrate 10 to form the channel stopping region 72 under the field oxide region 80. Typically, the oxidation step (the so-called field oxidation step) is performed in wet oxygen environment at 1000° C. for a period of time sufficient to oxidize the silicon substrate to the desired field oxide. While some lateral oxidation is shown under the silicon nitride-II remainder 64, the length of the "bird's beak" is shorter than that formed in the LOCOS process because there is no stress release oxide between the silicon nitride-II stripe and the silicon substrate. The stress release oxide in LOCOS technology, used to release the stress between the silicon nitride and silicon substrate, disadvantageously also provides a lateral diffusing path for the oxygen. According to the subject invention, the bird's beak is minimized because the stress release oxide is absent from the area adjacent to the exposed silicon. It is also noted that the dislocation defect along the edges of field oxide 80 are minimized because the silicon nitride-II is thin and partially in contact with the silicon substrate. These are similar to the experimental results of I. Magdo and A. Bohg which showed that both the formation of the bird's beak and the generation of dislocations were completely avoided for a 500 Angstroms thick, 2 um wide silicon nitride which is in direct contact with silicon substrate. (I. Magdo and A. Bohg, "Framed Recessed Oxide Scheme for Dislocation-Free Planar Si Structures," *J. Electrochem. Soc.: Solid-State Science and Technology*, Vol. 125, No. 6, pp. 932–936 (1978).) In addition, Y. Tamaki et al. found that the dislocation density after oxidation increases with the increase in the depth of silicon etching before oxidation. This is due to stress concentration resulting from the volume expansion of SiO$_2$ film during oxidation. (Y. Tamaki et al., "Evaluation of Dislocation Generation on Silicon Substrates by Selective Oxidation," *J. Electrochem. Soc.: Solid-State Science and Technology*, Vol. 130, No. 11, pp. 2266–2270 (1983). In this invention, the silicon substrate is unetched before field oxidation so that the dislocation density due to SiO$_2$ volume expansion is avoided.

Figure 11:
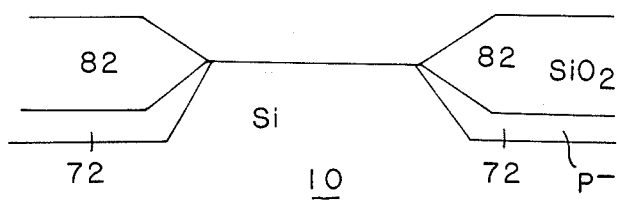
FIG. 11 illustrates the final isolation structure including the field isolation structure after the silicon nitride-I, silicon nitride-II, polysilicon and pad oxide layers are removed.

FIG. 11 shows the resulting structure after the silicon remainders 42 and 64, the polysilicon 34, and the pad oxide 22 are removed. In general, the silicon nitride remainders 42 and 64 are removed by using boiling H$_3$PO$_4$ at 180° C., the polysilicon remainder 34 by using reactive-ion etching with high selectivity to oxide, and the pad oxide remainder 22 by the use of a hydrofluoric acid stripping solution. A layer of the silicon dioxide 80 is also removed during these stripping steps. The remainders of silicon dioxide layers, designated by the reference character 82, form the final field oxide of the isolation region.

The foregoing description is for purposes of illustration only. It will be readily understood that many variations thereof, which will not depart from the spirit of the invention, will be apparent to those skilled in the art.

For example, the above process describes the formation of isolation regions using a p-type silicon wafer which is useful for isolation regions of an NMOS. In the case where it is desirable to form isolation regions for a PMOS, the ion-implantation is not necessary and an n-type silicon wafer would be used. Additionally, isolation regions for a CMOS may be formed by using an n-type or a p-type silicon wafer and modifying the above process by defining a p$^-$ field photo-resist coating prior to performing the ion-implantation step.

I claim:

1. A process for forming isolation regions on a semiconductor substrate, which comprises:
    a. anisotropically etching a laminate comprising (i) a silicon semiconductor substrate having thereon a silicon dioxide stress release layer, (ii) a polysilicon layer on said stress release layer, (iii) a first silicon nitride layer on said polysilicon layer, and (iv) a photo-resist masking active regions, so as to remove from said laminate the unmasked first layer of silicon nitride and the unmasked polysilicon layer completely;
    b. isotropically etching the resultant structure to partially undercut the vertical portions of the polysilicon under the first silicon nitride layer so as to form an overhang of said first silicon nitride layer over said polysilicon layer;
    c. stripping the photo-resist mask;
    d. etching the stress release layer to completely remove the portion thereof not covered by the polysilicon layer;
    e. depositing a second silicon nitride layer over the surface of the resulting structure;
    f. anisotropically etching the second layer of silicon nitride to completely remove the portion thereof not covered by the overhang and expose the surface of the semiconductor substrate;
    g. oxidizing the exposed semiconductor substrate so as to form a field oxide region; and h. removing the residual first and second layers of silicon nitride, polysilicon, and stress release layers.

2. The process of claim 1 wherein, after step f, the exposed semiconductor substrate is subject to ion-implantation.

3. The process of claim 1 wherein, after step f, a photo-resist layer is formed atop the substrate to define a p$^-$ field mask, the exposed semiconductor substrate is subject to an ion-implatation step, and the p$^-$ field mask is stripped.

4. The process of claim 1, 2 or 3 where the stress release layer is a pad oxide.

5. The process of claim 1 wherein the semiconductor substrate is an n-type silicon wafer.

6. The process of claim 1 whrein the process is used to define isolation regions of a PMOS.

7. The process of claim 1, 2 or 3 wherein the anisotropic etching is reactive-ion etching.

8. The process of claim 1, 2 or 3 wherein the isotropic etching is plasma etching.

9. The process of claim 1, 2 or 3 wherein the etching in step d is either with a buffered oxide etchant or with a diluted hydrogen fluoride solution.

10. The process of claim 1, 2 or 3 wherein the first and second silicon nitride layers are either LPCVD silicon nitride or PECVD silicon nitride.

11. The process of claim 2 wherein the semiconductor substrate is a p-type silicon wafer.

12. The process of claim 2 wherein the process is used to define isolation regions of an NMOS.

13. The process of claim 3 wherein the semiconductor substrate is either an n-type or a p-type silicon wafer.

14. The process of claim 3 wherein the process is used to define isolation regions of a CMOS.

* * * * *